US007227429B2

(12) United States Patent
Kawachi et al.

(10) Patent No.: US 7,227,429 B2
(45) Date of Patent: Jun. 5, 2007

(54) SURFACE ACOUSTIC WAVE DEVICE AND METHOD OF FABRICATING THE SAME

(75) Inventors: Osamu Kawachi, Yokohama (JP); Osamu Ikata, Yokohama (JP); Masanori Ueda, Yokohama (JP); Suguru Warashina, Kawasaki (JP)

(73) Assignees: Fujitsu Media Devices Limited, Yokohama (JP); Fujitsu Limited, Kawasaki (JP)

(*) Notice: Subject to any disclaimer, the term of this patent is extended or adjusted under 35 U.S.C. 154(b) by 0 days.

(21) Appl. No.: 10/809,926

(22) Filed: Mar. 26, 2004

(65) Prior Publication Data
US 2004/0207485 A1 Oct. 21, 2004

(30) Foreign Application Priority Data
Mar. 31, 2003 (JP) .............................. 2003-096577

(51) Int. Cl.
*H03H 9/72* (2006.01)
*H03H 9/64* (2006.01)
*H03H 3/08* (2006.01)

(52) U.S. Cl. ...................... 333/133; 333/193; 29/25.35
(58) Field of Classification Search ........ 333/193–196, 333/133
See application file for complete search history.

(56) References Cited

U.S. PATENT DOCUMENTS 5,847,489 A * 12/1998 Satoh et al. ................ 310/348
6,018,211 A    1/2000 Kanaboshi et al. ......... 310/313 R
6,114,635 A * 9/2000 Lakin et al. ................ 174/260
6,445,265 B1 * 9/2002 Wright ........................ 333/193
6,621,379 B1 * 9/2003 Goetz et al. ................ 333/193
6,822,326 B2 * 11/2004 Enquist et al. ............... 257/729
6,853,067 B1 * 2/2005 Cohn et al. .................. 257/704
2003/0080832 A1 * 5/2003 Enshasy ...................... 333/193

FOREIGN PATENT DOCUMENTS
EP      0 609 062 A1 * 8/1994

(Continued)

OTHER PUBLICATIONS

Takagi et al. "Wafer-Scale Room-Temperature Bonding Between Silicon And Ceramic Wafers By Means Of Argon-Beam Surface Activation", The 14th Conference on Micro Electro Mechanical Systems 2001, MEMS 2001, pp. 60-63, Jan. 2001.*

(Continued)

*Primary Examiner*—Barbara Summons
(74) *Attorney, Agent, or Firm*—Arent Fox LLP

(57) ABSTRACT

A surface acoustic wave device includes a piezoelectric substrate having a first surface on which comb-like electrodes, first pads connected thereto, and a first film are provided. The first film is located so as to surround the comb-like electrodes. A base substrate has a second surface on which second pads joined to the first pads and a second film joined to the first film are provided. The first and second films joined by a surface activation process define a cavity in which the comb-like electrodes and the first and second pads are hermetically sealed.

20 Claims, 17 Drawing Sheets

FOREIGN PATENT DOCUMENTS

| | | | |
|---|---|---|---|
| EP | 1 071 126 | | 1/2000 |
| JP | 54-14137 | | 2/1979 |
| JP | 4-293310 | | 10/1992 |
| JP | 5-235688 | * | 9/1993 |
| JP | 8-18390 | | 1/1996 |
| JP | 8-274575 A | | 10/1996 |
| JP | 8-330894 | * | 12/1996 |
| JP | 10-163798 | | 6/1998 |
| JP | 2000-68785 | * | 3/2000 |
| JP | 2001-053577 A | | 2/2001 |
| JP | 2001-110946 | | 4/2001 |
| JP | 2003-008394 A | | 1/2003 |

OTHER PUBLICATIONS

Tadatomo Suga, "Low Temperature Bonding by Means of the Surface Activated Bonding Method," J. Japan Institute of Metals, 35-5, May 1996, pp. 496-500, 612.

Hideki Takagi, "Room-Temperature Bonding of Silicon Wafers by Means of the Surface Activation Method," Report of Mechanical Engineering Laboratory No. 189, Dec. 2000, pp. cover, title page, table of contents, 68-75.

T. Shimatsu et al., "Metal Bonding During Sputter Film Deposition," Journal of Vacuum Science and technology A. Vacumn, Surfaces and Films, American Institute of Physic, vol. 16, No. 4, Jul. 1998. pp. 2125-2131.

* cited by examiner

SURFACE ACOUSTIC WAVE DEVICE AND METHOD OF FABRICATING THE SAME

BACKGROUND OF THE INVENTION

1. Field of the Invention

The invention generally relates to surface acoustic wave devices and methods of fabricating the same, and more particularly, to a surface acoustic wave device having a SAW chip hermetically sealed, and a method of fabricating the same.

2. Description of the Related Art

Recently, there has been a demand to downsize electric parts mounted to electronic devices and improve the performance thereof with downsizing and high performance of the electronic devices. For instance, there have been similar demands on surface acoustic wave (SAW) devices that are electric parts used as filters, delay lines, oscillators in electronic devices capable of transmitting and receiving radio waves.

A description will now be given of a filter device equipped with a conventional SAW device. FIG. 1A is a perspective view of a SAW filter 100, and FIG. 1B is a cross-sectional view taken along a line F—F shown in FIG. 1A. This type of SAW device is disclosed, for example, Japanese Patent Application Publication No. 8-18390 (see FIG. 4, particularly).

Referring to FIG. 1A, the SAW filter 100 includes a ceramic package 102 having a cavity 109, a metal cap 103 and a SAW chip 110. The SAW chip 110 is placed in the cavity 109, which is sealed with the metal cap 103. As shown in FIG. 1B, the package 102 has a three-layer structure composed of three joined substrates 102a, 102b and 102c. Electrode pads 105 are provided on the top of the substrate 102b, and foot patterns 107 are provided on the bottom of the substrate 102c. Wiring patterns 106 are provided on sides of the package 102, and connect the electrode pads 105 and the foot patterns 107. The SAW chip 110 is fixed to the bottom of the cavity 109 so that comb-like electrodes (an interdigital transducer: IDT) 113 on the SAW chip 110 face up. Electrode pads 114 on the SAW chip 110 are connected to the electrode pads 105 via wires 108. The metal cap 103 is bonded to the top surface of the package by a bonding material made of solder or resin, which material serves as a washer 104.

There is another proposal to mount the SAW chip in flip-chip fashion (see, for example, Japanese Patent Application Publication No. 2001-110946). FIGS. 2A and 2B show this type of SAW device. More particularly, FIG. 2A is a perspective view of a SAW chip 210 of a SAW filter 200, and FIG. 2B is a cross-sectional view of the SAW filter 200, which view corresponds to a cross section taken along the line F—F shown in FIG. 1A.

As shown in FIG. 2A, the SAW chip 210 has a piezoelectric material substrate (hereinafter referred to as piezoelectric substrate) 211. Comb-like electrodes 213 that form an IDT are formed on a main surface (upper surface) of the piezoelectric substrate 211. Electrode pads 214 are provided on the main surface and are electrically connected to the IDT 213 via wiring patterns. As shown in FIG. 2B, a package 202 has a cavity 209. Electrode pads 205 are provided on the bottom of the cavity 209, which is also referred to as die-attached surface. The pads 205 are positioned so as to correspond to the electrode pads 214 of the SAW chip 211. The SAW chip 210 is flip-chip mounted in the cavity 209 so that the IDT 213 and the electrode pads 214 face the die-attached surface. The electrode pads 214 and 205 are bonded via metal bumps 208 so that these pads are electrically and mechanically fixed together. The electrode pads 205 are electrically connected to foot patterns 207 on the backside of the package 202 by means of via-wiring lines 206, which penetrate the bottom portion of the package 202. A metal cap 203 closes an opening of the cavity 209 and is bonded to the package 202 by a bonding material 204.

A duplexer equipped with a transmit filter and a receive filter may be formed by using SAW filters as mentioned above. Such a duplexer will now be described with reference to FIGS. 3A and 3B. A duplexer 300 shown in these figures has a transmit filter 310a and a receive filter 310b, each of which filters is like the SAW filter 100. FIG. 3A shows a cross section of the duplexer 300, which corresponds to that taken along the line F—F shown in FIG. 1A. FIG. 3B is a plan view of a SAW chip 310.

Referring to FIG. 3A, the duplexer 300 has a package 302 in which the SAW chip 310 is mounted. A matching-circuit board 321 and a main board 322 are provided on the bottom side of the package 302. The matching-circuit board 321 is provided in such a way as to be sandwiched by the main board 322. As shown in FIG. 3B, the SAW chip 310 is equipped with the transmit filter 310a and the receive filter 310b. Each of the filters 310a and 310b has respective IDTs 313 arranged in ladder fashion. The IDTs 313 are connected to electrode pads 314 via wiring patterns 315.

The SAW filter or duplexer as mentioned above is required to have the SAW chip hermetically sealed. The metal cap is used, along with bonding material or resin, to accomplish hermetically sealing.

However, there are drawbacks to be solved. A large joining area (seal width) at the interface between the package and the cap is needed to hermetically seal the cavity with high reliability. However, this prevents downsizing of the package. Downsizing of package is also restricted due to the use of wires because the wires need a relatively wide pattern for bonding. The package is the multilayer substrate made of ceramics, which is comparatively expensive. The device needs the process of assembling the cap, chip and package device, and is therefore costly.

It is an object of the present invention to provide a downsized, less expensive, productive SAW device and a method of fabricating the same.

This object of the present invention is achieved by a surface acoustic wave device comprising: a piezoelectric substrate having a first surface on which comb-like electrodes, first pads connected thereto, and a first film are provided, the first film being located so as to surround the comb-like electrodes; and a base substrate having a second surface on which second pads joined to the first pads and a second film joined to the first film are provided, the first and second films joined by a surface activation process defining a cavity in which the comb-like electrodes and the first and second pads are hermetically sealed.

The above objects of the present invention are also achieved by a method of fabricating a surface acoustic wave device comprising the steps of: (a) forming a first film on a first surface of a piezoelectric substrate on which comb-like electrodes and first pads are formed so as to be surround by the first film; (b) forming a second film on a second surface of a base substrate, the second film corresponding to the first film in position; (c) subjecting a surface activation process to surfaces of the first and second films; and (d) joining the first and second films so as to join activated surfaces thereof, the comb-like electrodes being hermetically sealed in a cavity defined by the first and second films.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 4A:
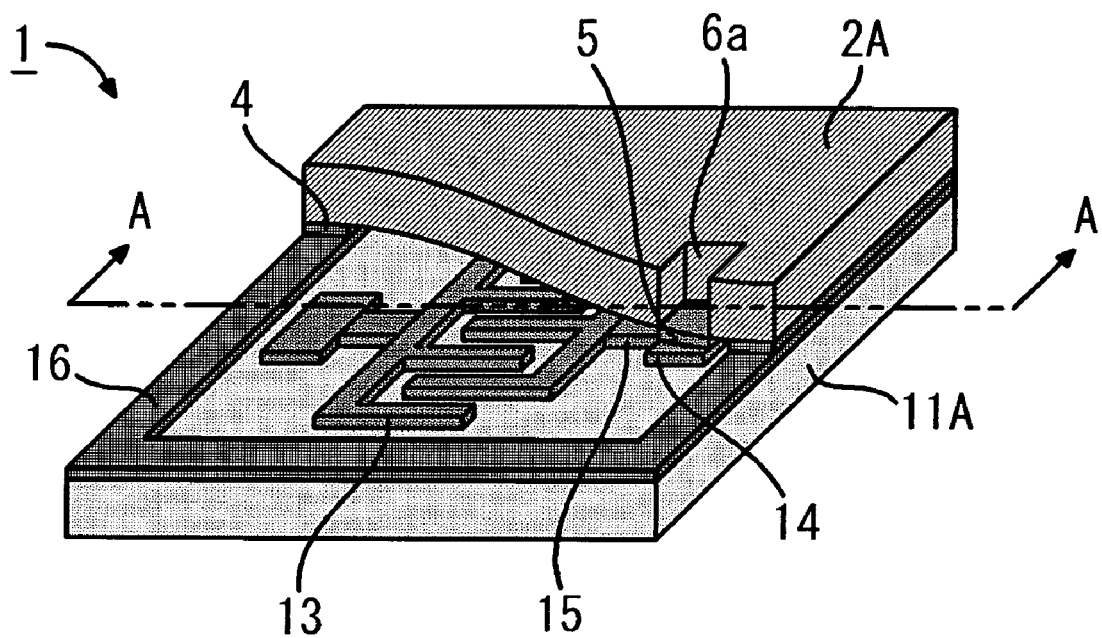
FIG. 4A is a perspective view of a SAW device in which the fundamental concepts of the present invention are realized.
Figure 4B:
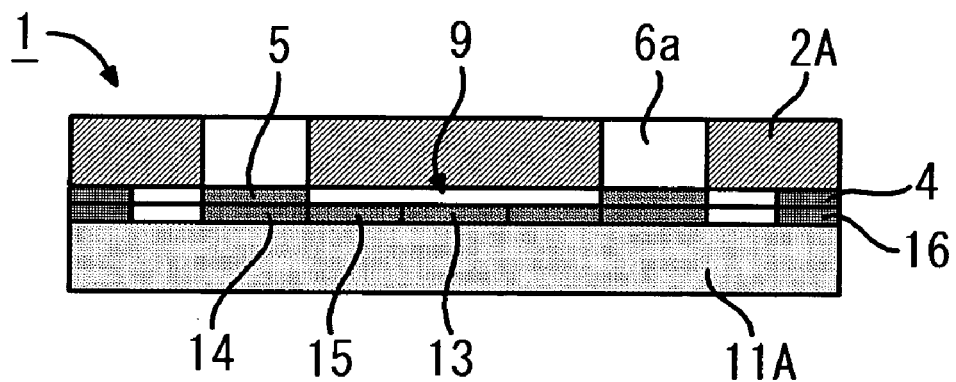
FIG. 4B is a cross-sectional view taken along a line A—A shown in FIG. 4A.

A description will now be given of the fundamental concepts of the present invention. FIG. 4A is a perspective view of a SAW device 1 having the fundamental concepts of the invention, and FIG. 4B is a cross-sectional view taken along a line A—A shown in FIG. 4A.

The SAW device 1 has a piezoelectric substrate 11A and a base substrate 2A. On the main (upper) surface of the piezoelectric substrate 11A, provided are comb-like electrodes (IDT) 13, electrode pads 14 and wiring patterns 15. Electrode pads 5 are provided on a main surface of the base substrate 2A. The electrode pads 5 are provided at positions that correspond to the electrode pads 14.

A metal film 16 is provided on a peripheral potion on the main surface of the piezoelectric substrate 11A. The metal film 16 is located further out than the IDT 13 and the pads 14 so as to surround these patterns. Similarly, a metal film 4 is provided on a peripheral portion on the main surface of the base substrate 2A. The metal films 16 and 4 are joined so that a cavity 9 defined by the piezoelectric substrate 11A and the base substrate 2A can be hermetically sealed. In the cavity 9 thus sealed hermetically, there are the IDT 13, the electrode pads 14 and the wiring patterns 15.

When the substrates 11A and 2A are joined so that the metal films 16 and 4 are joined, the electrode pads 14 and 5 are joined. An electric contact with the pads 14 on the substrate 11A can be made on the backside of the base substrate 2A via a via-hole 6a that penetrates the base substrate 2A. The via-hole 6a may be full of a conductor such as a metal bump, so that a via-wiring line can be made. The input and output terminals of the IDT 13 can be extended up to the backside of the base substrate 2A.

The piezoelectric substrate 11A may be a piezoelectric single-crystal substrate of a 42° Y-cut X-propagation lithium tantalate ($LiTaO_3$:LT). The LT substrate has a linear expansion coefficient of 16.1 ppm/° C. in the X direction in which the SAW is propagated. The LT substrate may be replaced by a piezoelectric single-crystal substrate of Y-cut lithium niobate ($LiNbO_3$:LN).

The IDT 13, the electrode pads 14, the wiring patterns 15 and the metal film 16 may be made of a conductor that contains, as the major component, at least one of gold (Au), aluminum (Al), copper (Cu), titanium (Ti), chromium (Cr) and tantalum (Ta). The patterns may be a single layer or a laminate composed of at least two conductive layers, each of which contains at least one of Au, Al, Cu, Ti, Cr and Ta. The conductors may be deposited by, for instance, sputtering.

The base substrate 2A may be made of an insulator that contains, as the major component, at least one of silicon, ceramics, aluminum ceramics, BT (Bismuthimido-Triazine) resin, PPE (Polyphenylene-Ethel), polyimide resin, glass-epoxy and glass-cloth. The first embodiment employs silicon for the base substrate 2A because silicon can easily be processed and handled at the stage of wafer. Preferably, the base substrate 2A is made of a silicon substance that has a resistivity as low as 1000 Ω·m or greater in order to avoid degradation of the filter characteristic stemming from the resistance of silicon.

The electrode pads 5 and the metal film 4 on the main surface of the base substrate 2A may be made of a conductor that contains, as the major component, at least one of Au, Al, Cu, Ti, Cr and Ta. The conductors may be deposited by, for instance, sputtering. The pads 5 and the film 4 may be a single layer or a laminate of at least two layers.

An adhesive may be used to join the substrates 11A and 2A. However, it is preferable to directly bond the substrates 11A and 2A. In this case, the bonding strength can be enhanced by applying a surface activation process to the joining surfaces of the substrates 11A and 2A. Now, a description will be given, with reference to FIGS. 5A and 5B, of the joining method that employs the surface activation process.

Figure 5A:
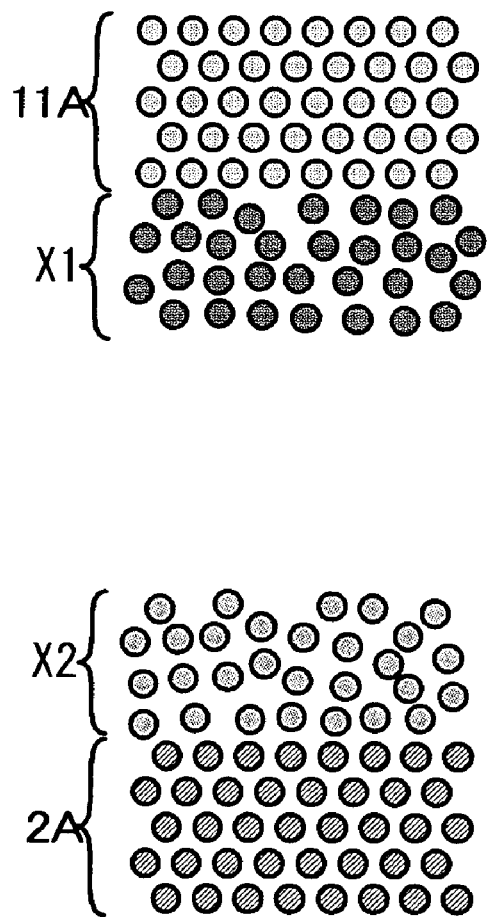
FIGS. 5A and 5B show a surface activation process.

Referring to FIG. 5A, both of the substrates 11A and 2A are cleaned through RCA cleaning or the like, so that impurities X1 and X2 including compounds and adsorbate that adhere to the surfaces, especially the joining surfaces, are removed (cleaning process). RCA cleaning is one of the techniques that utilize solutions such as a cleaning solution of ammonia, hydrogen peroxide, and water, mixed at a volume mixing ratio of 1:1–2:5–7, and a cleaning solution of hydrochloric acid, hydrogen peroxide, and water, mixed at a volume mixing ratio of 1:1–2:5–7.

Figure 5B:
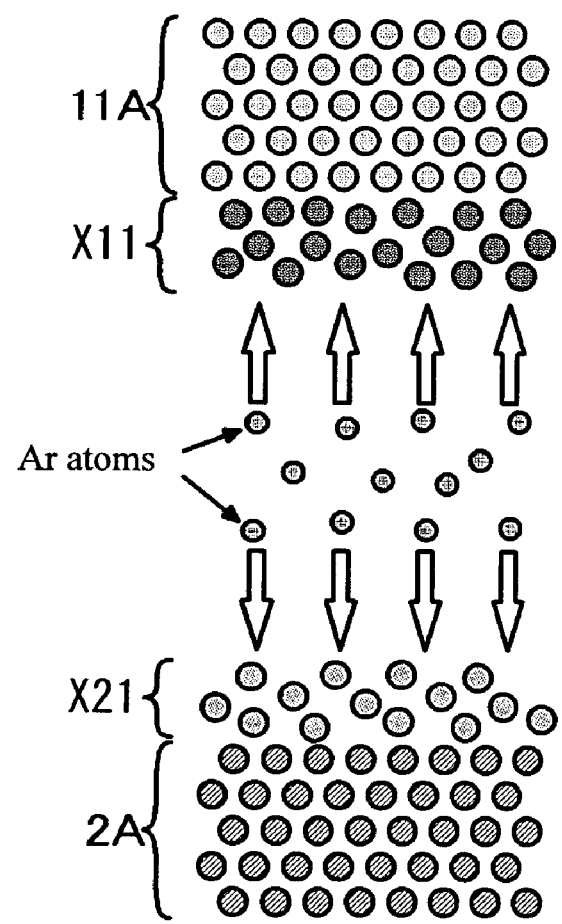

After the cleaned substrates are dried (drying process), as shown in FIG. 5B, the joining surfaces of the substrates 11A and 2A are exposed to ion beams, neutralized high-energy atom beams, or plasma of inert gas such as argon (Ar) or oxygen, so that residual impurities X11 and X21 are removed, and that the surfaces can be activated (activation process). The particle beams or plasma to be used are selected according to the materials of the substrates to be joined. For example, the surface activation process with inert gas is useful for many materials. Particularly, for silicon dioxide ($SiO_2$), ion beam or plasma of oxygen may also be used.

The piezoelectric substrate 11A and the silicon substrate 2A are then positioned and joined to each other (joining process) in such a manner that the metal films 16 and 4 are positioned and the electrode pads 14 and 5 are positioned. For most materials, this joining process may be carried out in a vacuum or in an atmosphere of a high purity gas such as an inert gas, though it may be carried out in the air. Also, it might be necessary to press the substrates 11A and 2A from both sides. This joining process can be carried out at room temperature or by heating the substrates 11A and 2A at a temperature of 100° C. or lower. The use of heating may increase the joining strength of the substrates 11A and 2A.

The present method does not need an annealing process at 1000° C. or higher after the substrates 11A and 2A are joined. Thus, the substrates 11A and 2A can be reliably joined without any damage. In addition, the method with the surface activation process does not need any adhesive agent such as resin or metal and realizes a height-reduced package, so that downsizing of package can be achieved. Further, a sufficient joining strength can be obtained by a smaller joining interface area than that for the adhesive, so that the package can be miniaturized. The joining process employed in the invention can be applied to the wafer. Thus, a large number of SAW devices 1 can be produced at a time by using a wafer-level piezoelectric substrate having multiple piezoelectric substrates integrally arranged in rows and columns and a wafer-level base substrate having multiple base substrates integrally arranged in rows and columns. This realizes a simplified production process and an improved yield.

When the metal films 4 and 16 contain gold, these films can be joined more tightly because gold is comparatively soft. The films 4 and 16 are joined via joining surfaces that contain gold by the surface activation process. Only one of the metal films 4 and 16 may contain gold.

Based on the above-mentioned concepts of the present invention, the cavity 9 that houses the IDT 13 can be minimized. The use of the surface activation process for joining the piezoelectric substrate 11A and the base substrate 2A realizes a reduced joining interface area while a sufficient joining strength can be secured. This contributes to downsizing the SAW device. The base substrate 2A can be processed at the wafer level and may be made of silicon that is less expensive. This simplifies the fabrication process and produces the less-expensive SAW device at an improved yield. Now, a description will be given of embodiments of the present invention based on the above-mentioned concepts.

(First Embodiment)

Figure 6A:
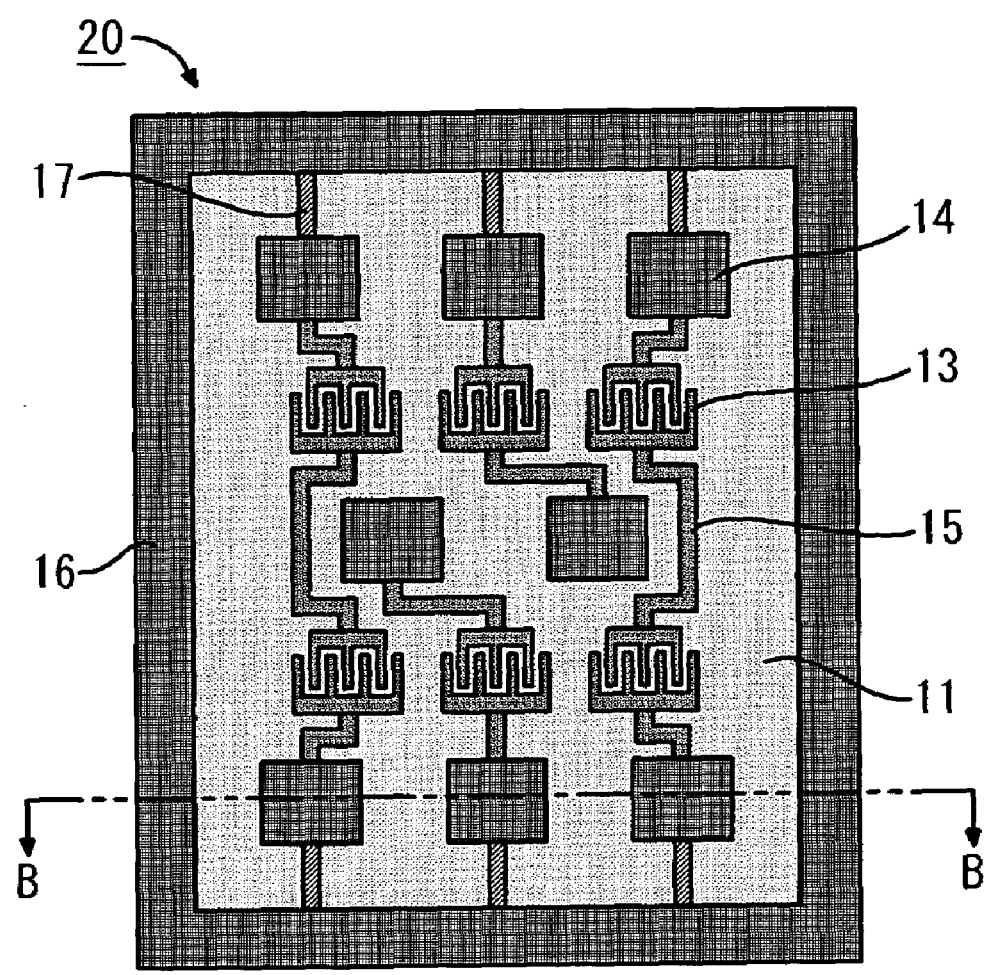
FIG. 6A is a plan view of a SAW chip according to a first embodiment of the present invention.
Figure 6B:
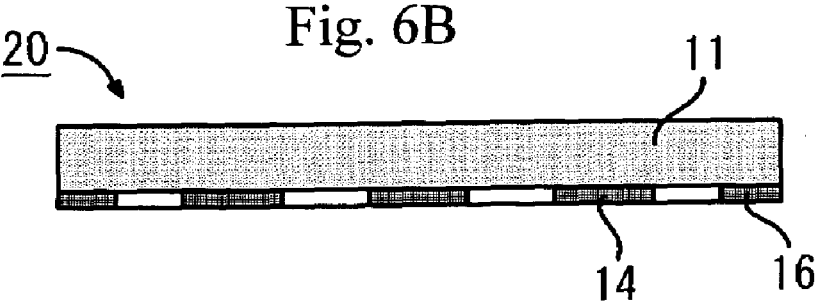
FIG. 6B is a cross-sectional view taken along a line B—B shown in FIG. 6A.
Figure 7A:
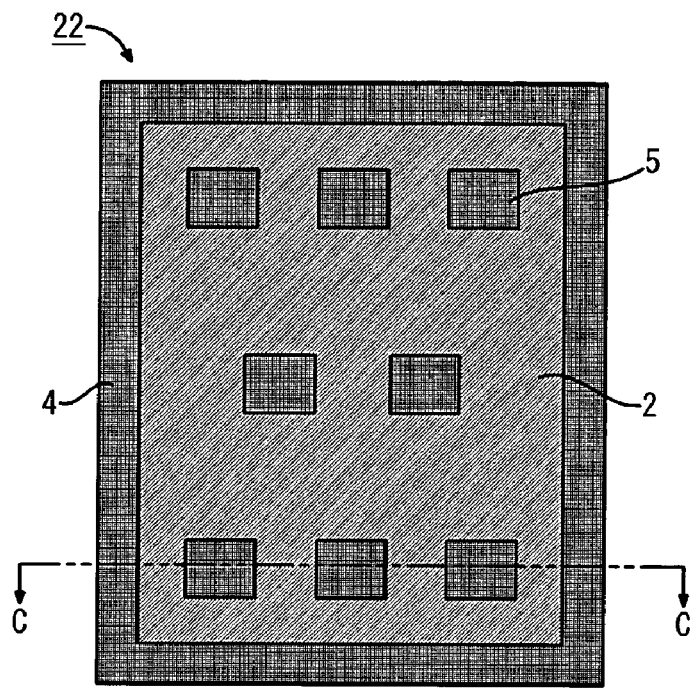
FIG. 7A is a plan view of a base substrate used in the first embodiment of the present invention.
Figure 7B:
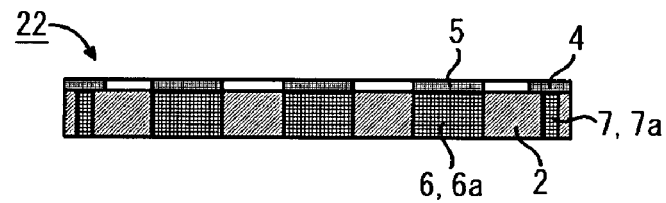
FIG. 7B is a cross-sectional view taken along a line C—C shown in FIGS. 7A and 7C.
Figure 7C:
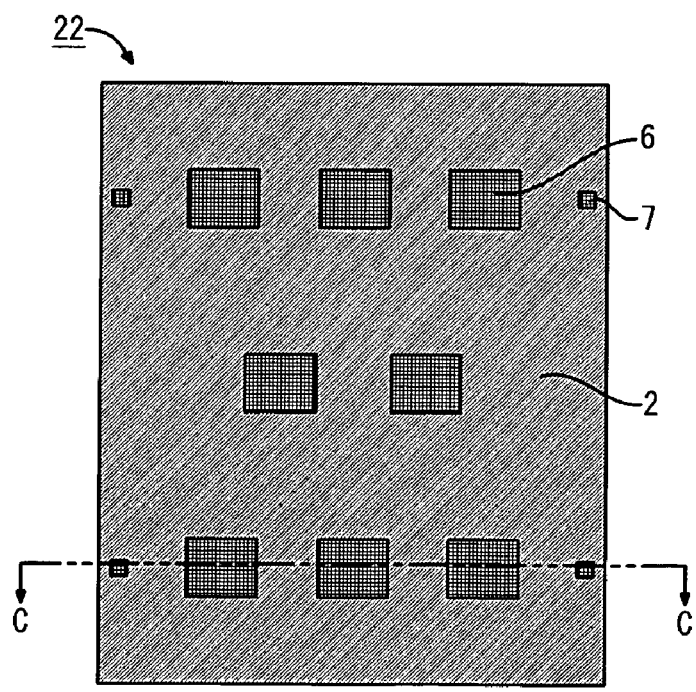
FIG. 7C is a bottom view of the base substrate shown in FIGS. 7A and 7B.
Figure 8:
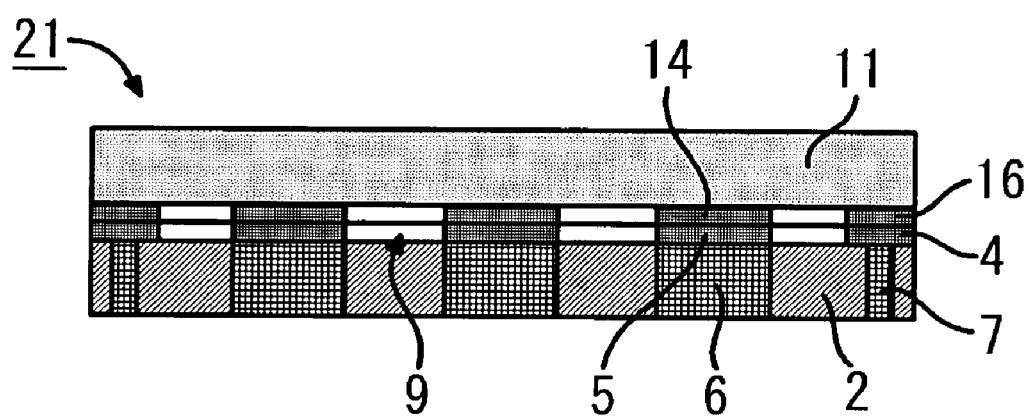
FIG. 8 is a cross-sectional view of a SAW device according to the first embodiment of the present invention.

A description will now be given of a first embodiment of the present invention. FIGS. 6A, 6B, 7A, 7B, 7C and 8 illustrate a SAW device 21 according to the first embodiment. More particularly, FIG. 6A is a plan view of a SAW chip 20 of the SAW device 21, and FIG. 6B is a cross-sectional view taken along a line B—B shown in FIG. 6A. FIG. 7A is a plan view of a base substrate 22 of the SAW device 21, FIG. 7B is a cross-sectional view taken along a line C—C shown in FIG. 7A, and FIG. 7C is a bottom view of the base substrate 22. FIG. 8 is a cross-sectional view of the SAW device 21, which corresponds to a cross section taken along the line B—B or C—C mentioned before.

As shown in FIGS. 6A and 6B, the SAW chip 20 has an LT substrate 11 having the main surface on which IDTs 13 connected in ladder arrangement, electrode pads 14 and wiring patterns 15 that connect the IDTs 13 and the electrode pads 14. The IDTs 13, the electrode pads 14 and the wiring patterns 15 have been described previously. The metal film 16 is provided on the main surface so as to surround the IDTs 13 and the electrode pads 14. The metal film 16 is connected to the electrode pads 14 via wiring patterns 17, which have relatively high resistance values.

As is shown in FIGS. 7A through 7C, the base substrate 22 may be a silicon substrate 2 having the main surface on which the electrode pads 5 are arranged so as to correspond to the electrode pads 14 in position. The electrode pads 5 have been described.

The metal film 4 is formed on the base substrate 22 so as to surround the electrode pads 5. The metal film 4 corresponds to the metal film 16 in position. The metal film 4 is electrically extended to the backside of the silicon substrate 2 by means of the via conductors 7 that penetrate the silicon substrate 2. The metal film 4 may be grounded on the backside of the silicon substrate 2 through the via conductors 7. In the assembled state, the IDTs 13, the electrode pads 14 and 5 and the metal films 16 and 4 are all grounded.

The SAW chip 20 is joined to the base substrate 22 so that the main surface of the SAW chip 20 faces the main surface of the base substrate 22. That is, the SAW chip 20 is mounted in the facedown state. This joining results in the SAW device 21 shown in FIG. 8. The aforementioned surface activation process can be applied to the joining. The electrode pads 14 and 5 are joined at the time of joining the SAW chip 20 to the base substrate 22.

A description will now be given of a method of fabricating the SAW device 21 with reference to FIGS. 9A through 9J, and FIGS. 10A through 10F. FIGS. 9A through 9J show a process of producing the SAW chip 20 of the SAW device 21, and FIGS. 10A through 10F show a process of producing the base substrate 22.

Figure 9A:
FIGS. 9A through 9J show a method of producing the SAW chip shown in FIGS. 6A and 6B.
Figure 9B:
Figure 9C:
Figure 9D:
Figure 9E:

The step of FIG. 9A prepares the LT substrate 11, which is, for example, 250 μm thick. Next, as shown in FIG. 9B, an electrode film 13A, which contains a major component of a metal of aluminum or the like, is formed on the main surface of the LT substrate 11. The electrode film 13A is an underlying layer of the IDTs 13, the electrode pads 14, the wiring patterns 15 and the metal film 16. Then, as shown in FIG. 9C, a mask 25 is provided on the electrode film 13A. The mask 25 is photolithographically patterned into the IDTs 13, the electrode pads 14, the wiring patterns 15 and the metal film 16. Thereafter, the electrode film 13A is etched so that a patterned electrode film 13B can be formed, as shown in FIG. 9D.

Figure 9F:
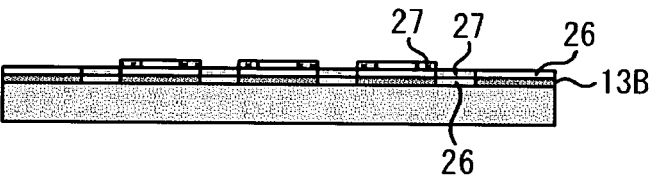
Figure 9G:
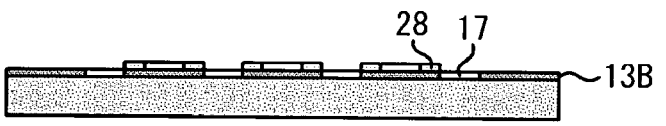

The patterned film 13B is the underlying layer of the IDTs 13, the electrode pads 14, the wiring patterns 15 and the metal film 16. The mask 25 that remains after etching is removed, and an insulating film such as silicon oxide (SiO$_2$) is provided so as to cover the entire surface including the patterned electrode film 13B. Then, as shown in FIG. 9F, a patterned mask 27 for forming the high-resistance wiring patterns 17 is formed photolithographically. Then, as shown in FIG. 9G, the insulating film 26 is etched with the mask 27, so that the wiring patterns 17 can be formed. An insulation film 28 may be provided on the electrode film 13B in order to protect it, as shown in FIG. 9G.

Figure 9H:
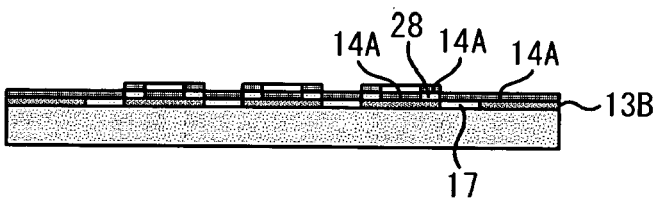
Figure 9I:
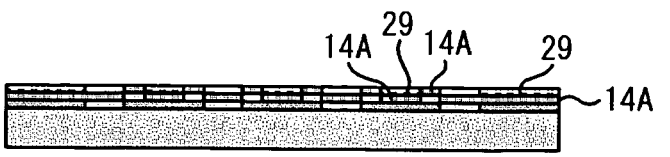
Figure 9J:

Then, as shown in FIG. 9H, a metal film 14A is provided so as to cover the entire surface, and a mask 29 is photolithographically formed, as shown in FIG. 9I. The mask 29 is used to partially remove the metal film 14A for defining the IDTs 13, the electrode pads 14 and the metal film 16. Then, etching is carried out (liftoff), so that the IDTs 13, the electrode pads 14, the wiring patterns 17 and the metal film 16 can be defined, as shown in FIG. 9J, in which only the pads 14 and metal film 16 are shown for the sake of simplicity. Preferably, the IDTs 13, the electrode pads 14 and the wiring patterns 17 have almost the same thickness as the metal film 16. This avoids problems that may be caused at the time of joining the base substrate 22 and the SAW chip 20. If there is a considerable difference in thickness, the IDTs 13 may contact another element or the pads 14 may not contact the corresponding electrode pads 5.

The electrode pads 14 and the metal film 16 are connected by the wiring patterns 17. However, the wiring patterns 17 may be omitted when the LT substrate 11 has a resistivity as high as 10–14 to 10–7 Ω·m. This further facilitates to simplification of the production process.

The base substrate 22 is produced as follows. The step of FIG. 10A prepares the silicon substrate 2, which is, for example, 250 μm thick. A metal film 4A, from which the electrode pads 5 and the metal film 4 will be defined later, is formed on the main surface of the silicon substrate 2.

Figure 10A:
FIGS. 10A through 10F show a method of producing the base substrate shown in FIGS. 7A through 7C.
Figure 10B:
Figure 10C:
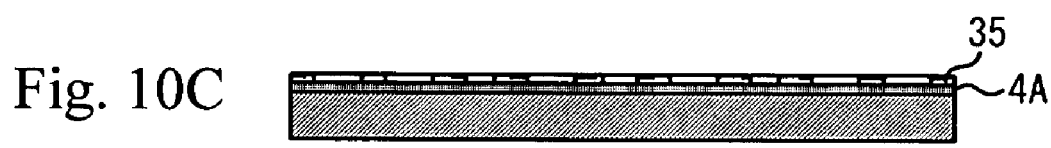
Figure 10D:
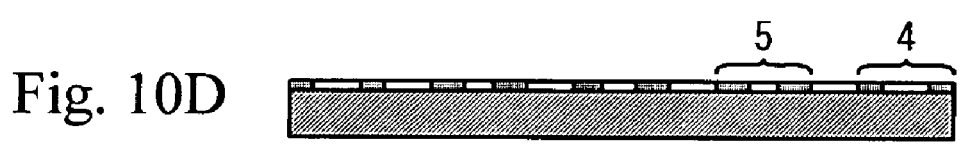

Then, as shown in FIG. 10C, a mask 35 used to shape the metal film 4A into the electrode pads 5 and the metal film 4 is photolithographically formed, and etching is then carried out as shown in FIG. 10D. The mask 35 includes patterns for defining the vias 6a and 7a, which electrically extend the electrode pads 5 and the metal film 4 to the backside of the silicon substrate 2.

Figure 10E:
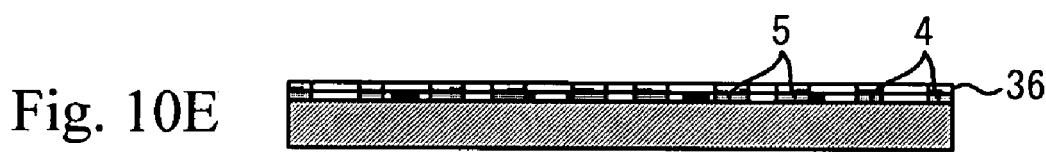
Figure 10F:
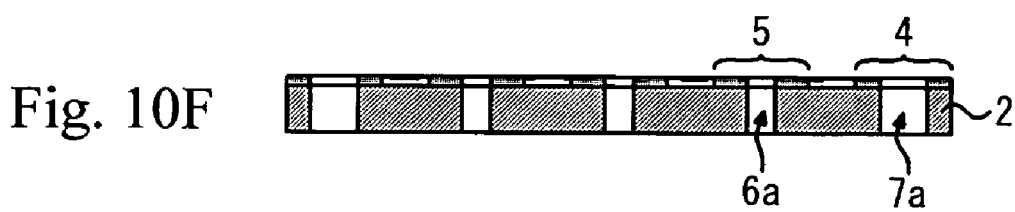

The vias 6a and 7a are formed as follows. A mask 36 patterned into the vias 6a and 7a is photolithographically formed, as shown in FIG. 10E. Then, the silicon substrate 2 is subjected to reactive ion etching (RIE), preferably, deep-RIE, so that the vias 6a and 7a extending vertically can be formed. The mask 36 that remains after etching is removed.

The SAW chip 20 and the base substrate 22 thus produced are joined by the process that has been described with reference to FIGS. 5A and 5B. This joining results in the SAW device 21. The vias 6a and 7a are filled with a conductor such as metal bumps, so that the via-wiring lines 6 and 7 can be produced. The conductor may be applied to the vias 6a and 7a before or after joining the substrates 11 and 2.

All the steps of FIGS. 10A through 10F are carried out from the main surface of the base substrate 22. This holds true for even deep-RIE shown in FIG. 10F. However, deep-RIE may be carried out from the backside of the silicon substrate 2 opposite to the front side on which the metal film 4A is formed. This alternative process will now be described with reference to FIGS. 11A through 11F.

Figure 1A:
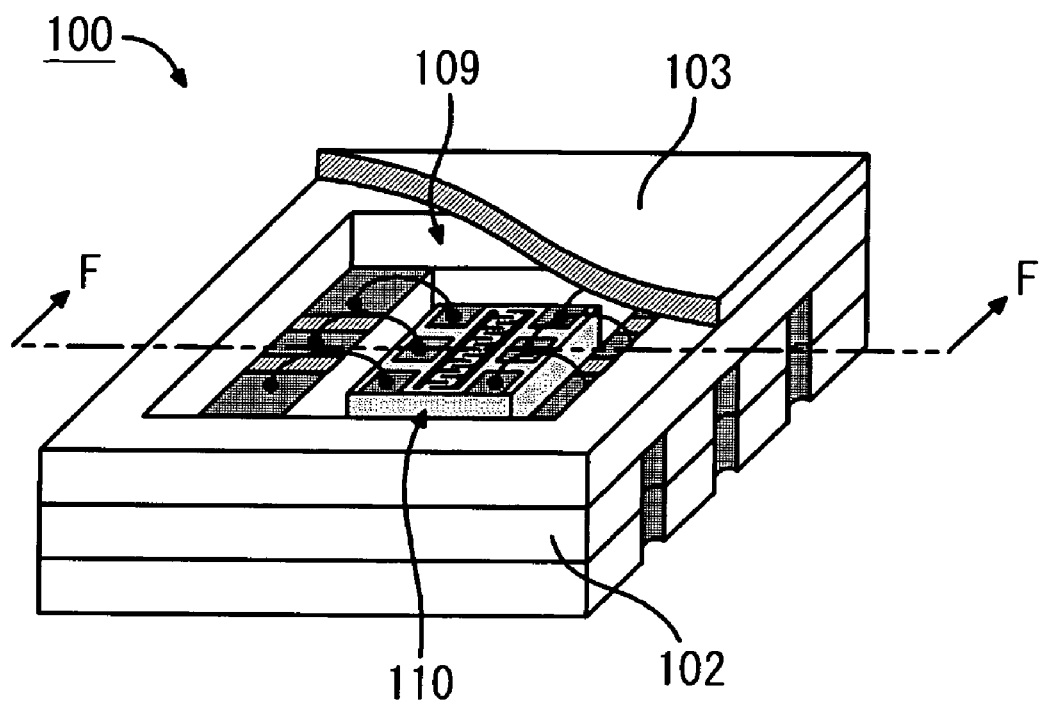
FIG. 1A is a perspective view of a conventional SAW device.
Figure 1B:
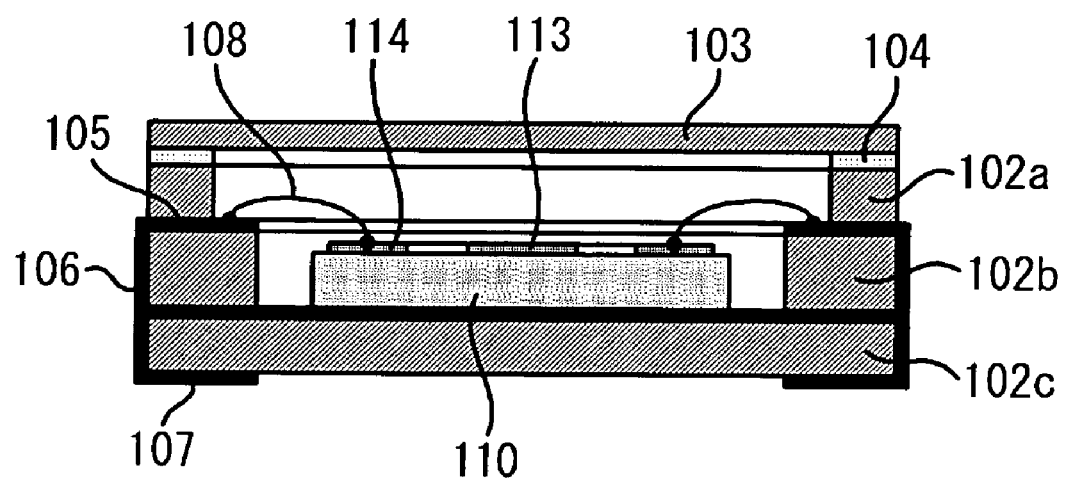
FIG. 1B is a cross-sectional view taken along a line F—F shown in FIG. 1A.
Figure 2A:
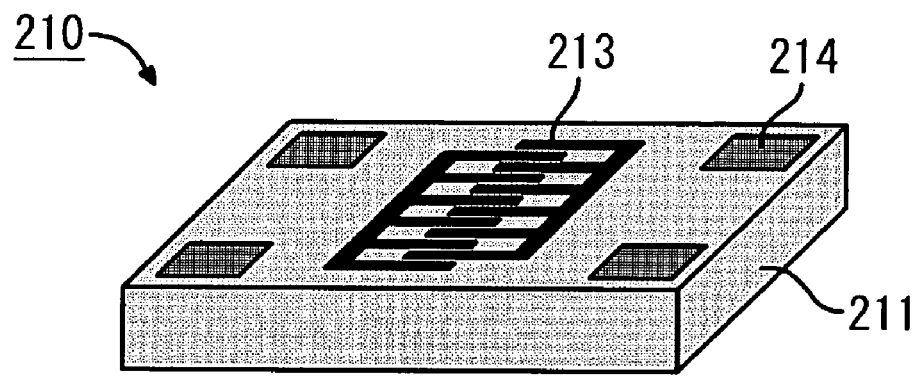
FIG. 2A is a perspective view of a SAW chip used in a conventional SAW device shown in FIG. 2B.
Figure 2B:
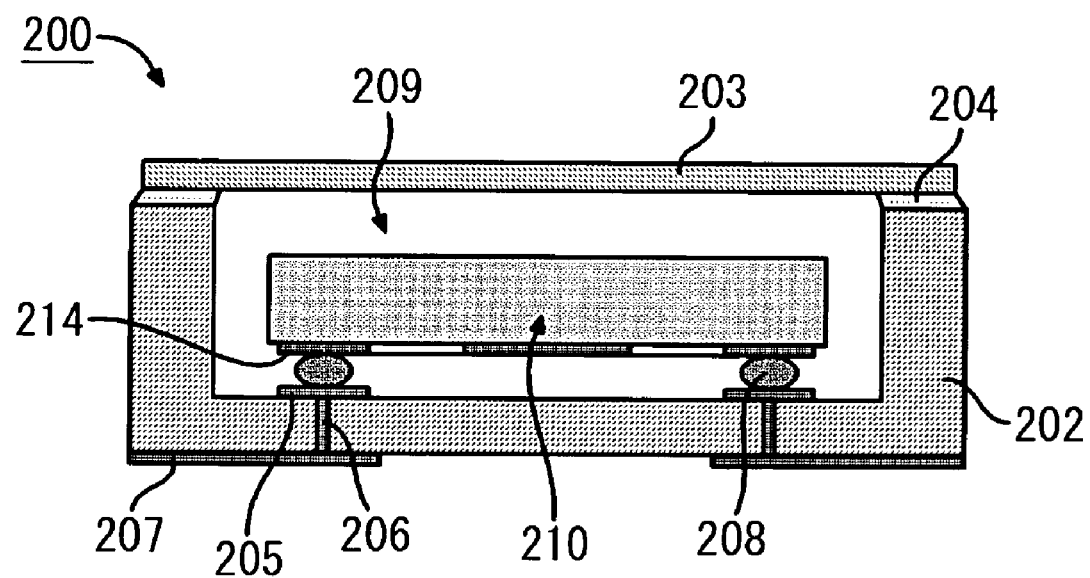
FIG. 2B is a cross-sectional view of the conventional SAW device that has the SAW chip shown in FIG. 2A.
Figure 3A:
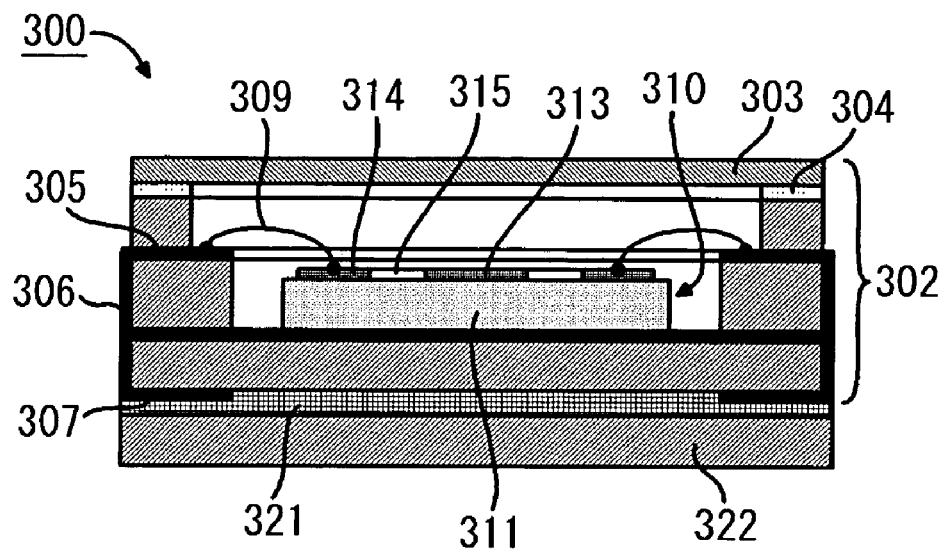
FIG. 3A is a cross-sectional view of a conventional duplexer.
Figure 3B:
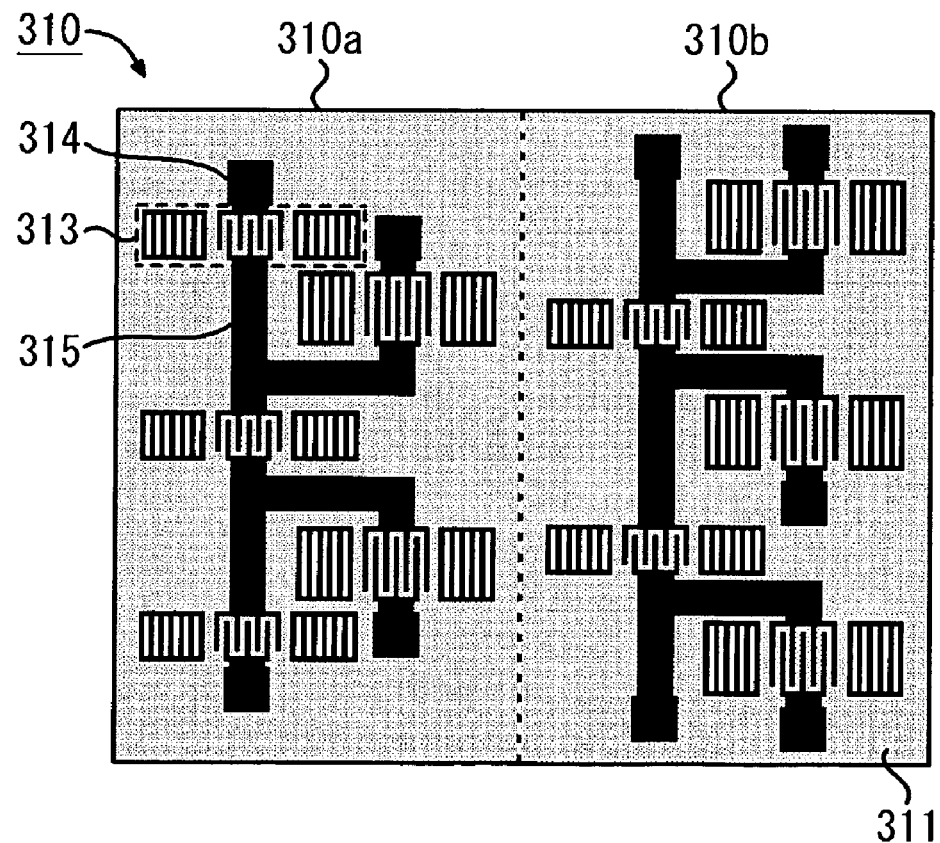
FIG. 3B is a plan view of a SAW chip used in the duplexer shown in FIG. 3A.
Figure 11A:
FIGS. 11A through 11F show another method of producing the base substrate shown in FIGS. 7A through 7C.
Figure 11B:
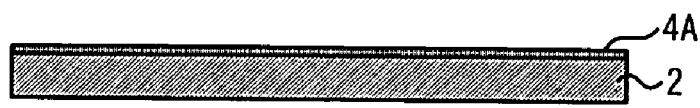
Figure 11C:
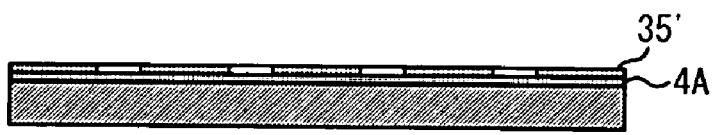
Figure 11D:
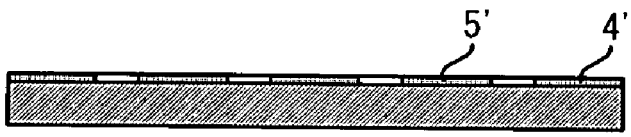

The steps of FIGS. 11A and 11B are the same as those of FIGS. 10A and 10B. The step of FIG. 11C photolithographically forms a mask 35' for patterning the metal film 4A into electrode pads 5' and an electrode film 4'. Then, as shown in FIG. 1D, etching is carried out with the mask 35', so that the pads 5' and the metal film 4' can be formed. The mask 35' does not have any pattern for defining the vias 6a and 7a.

Figure 11E:
Figure 11F:
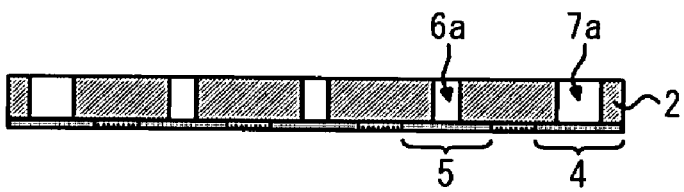

Then, as shown in FIG. 11F, a mask 36' is formed on the backside of the silicon substrate 2. FIGS. 11E and 11F illustrate the silicon substrate 2 that is turned upside down. The silicon substrate 2 is then etched by RIE, preferably deep-RIE, so that vias 6a and 7a can be formed, as shown in FIG. 11F. The mask 36' that remains after etching is removed.

The above process does not each the metal film 4' and the electrode patterns 5', so that the metal films 4' and 16 and the electrode pads 5' and 14 can be self-aligned in joining. This simplifies the production process greatly. In the above-mentioned alternative process, the SAW chip 20 produced by the process shown in FIGS. 9A through 9J can be used.

The above-mentioned fabrication methods complete the SAW chip 20 and the base substrate 22 separately, and then join them. Besides, some process may be applied after the SAW chip 20 and the base substrate 22 are joined. For example, the vias 6a and 7a may be formed in the silicon substrate 2 after joining. This will now be described with reference to FIGS. 12A through 12G. The following process uses the SAW chip prepared by the process described with reference to FIGS. 9A through 9J.

Figure 12A:
FIGS. 12A through 12G show another process of producing the SAW device shown in FIG. 8.
Figure 12B:
Figure 12C:
Figure 12D:
Figure 12E:
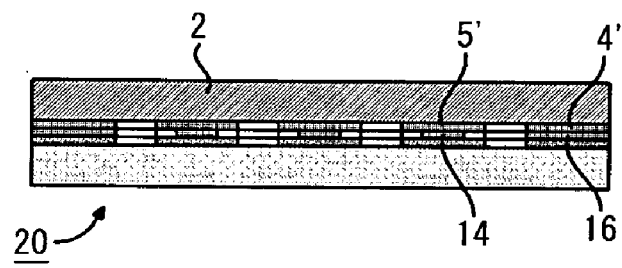
Figure 12F:
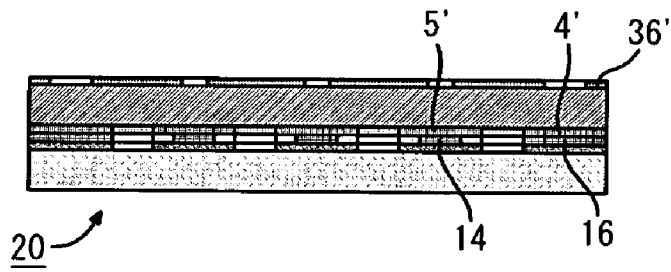
Figure 12G:
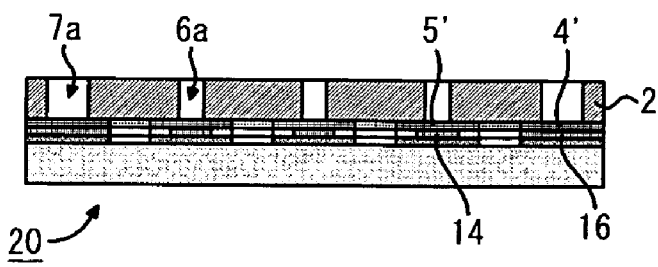

The steps of FIGS. 12A through 12D are the same as those of FIGS. 11A through 11D. The subsequent step of FIG. 12E joins the SAW chip 20 to the main surface of the silicon substrate 2. Then, as shown in FIG. 12F, a mask 36' is formed on the backside of the silicon substrate 2, which is then subjected to RIE, preferably, deep-RIE. This results in the vias 6a and 7a in the silicon substrate 2, as shown in FIG. 12G.

The above process does not etch the metal film 4' and the electrode pads 5'. Thus, the metal films 4' and 16 and the electrode pads 5' and 14 can be self-aligned at the time of joining. This simplifies the production process. The SAW device 21 thus produced has the aforementioned structure and effects.

(Second Embodiment)

Figure 13A:
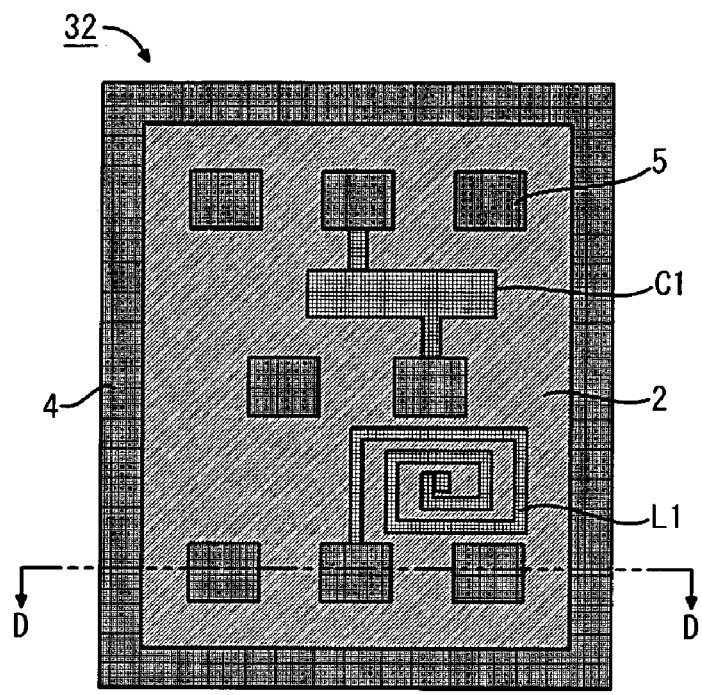
FIG. 13A is a plan view of a base substrate according to a second embodiment of the present invention.
Figure 13B:
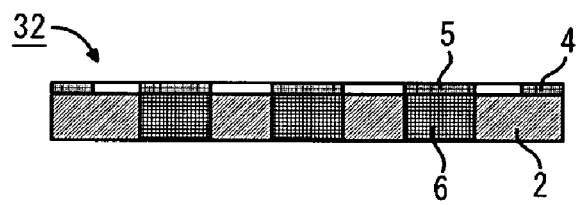
FIG. 13B is a cross-sectional view taken along a line D—D shown in FIGS. 13A and 13C.
Figure 13C:
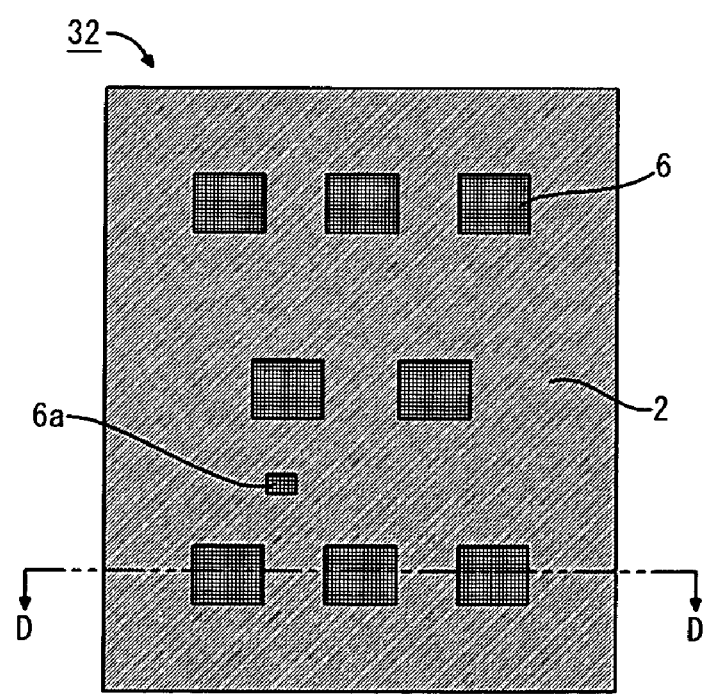
FIG. 13C is a bottom view of the base substrate shown in FIGS. 13A and 13B.

FIGS. 13A through 13C show a base substrate 32 employed in a SAW device according to a second embodiment of the present invention. More particularly, FIG. 13A is a plan view of the base substrate 32, FIG. 13B is a cross-sectional view taken along a line D—D shown in FIG. 13A, and FIG. 13C is a backside view of the base substrate 32. The SAW chip used in the second embodiment may be the same as the SAW chip 20 used in the first embodiment.

Figure 14:
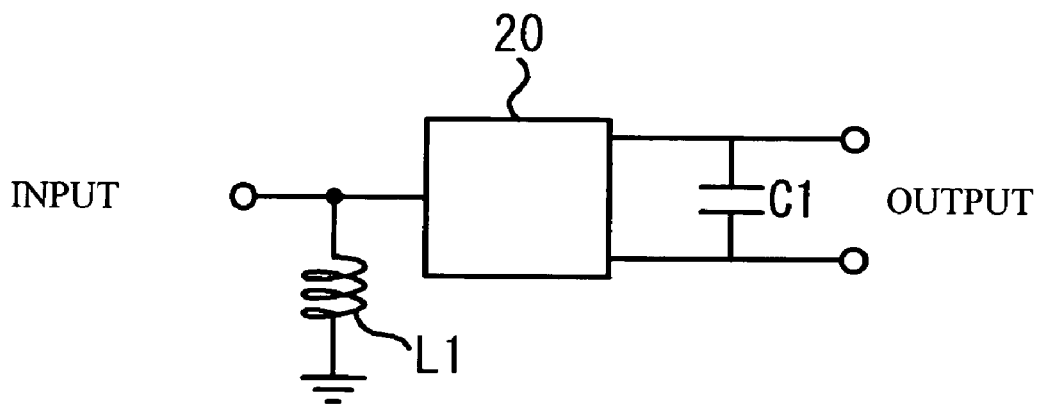
FIG. 14 is a circuit diagram of the SAW device according to the second embodiment.

A given electric element is formed on the main surface of the base substrate 32. The electric element may, for example, be a matching circuit, which changes the input impedance of the SAW chip 20 so as to make impedance matching with an external circuit (impedance conversion). In FIG. 13A, the impedance matching circuit is composed of an inductor L1 and a capacitor C1. FIG. 14 shows a circuit configuration of the impedance matching circuit. The inductor L1 is provided between an input line extending from an input end and ground, and the capacitor C1 is provided between lines connected to two output ends. The impedance matching circuit thus formed prevents degradation due to impedance mismatch with an external circuit. The electric element mountable on the base substrate 32 is not limited to the impedance matching circuit but may be any component, which may be selected in terms of objects, applications and characteristics required.

The electric element may be simultaneously formed along with the electrode pads 5 and the metal film 4 or may be formed before or after these patterns are formed. The electric element may be made of copper (Cu), aluminum (Al) or gold (Au) deposited by sputtering or the like.

The SAW device includes the electric element so that it does not need it externally. The SAW device is thus usable to various applications. The other structures, fabrication method and effects of the SAW device according to the second embodiment are the same as those of the first embodiment.

(Third Embodiment)

Figure 15A:
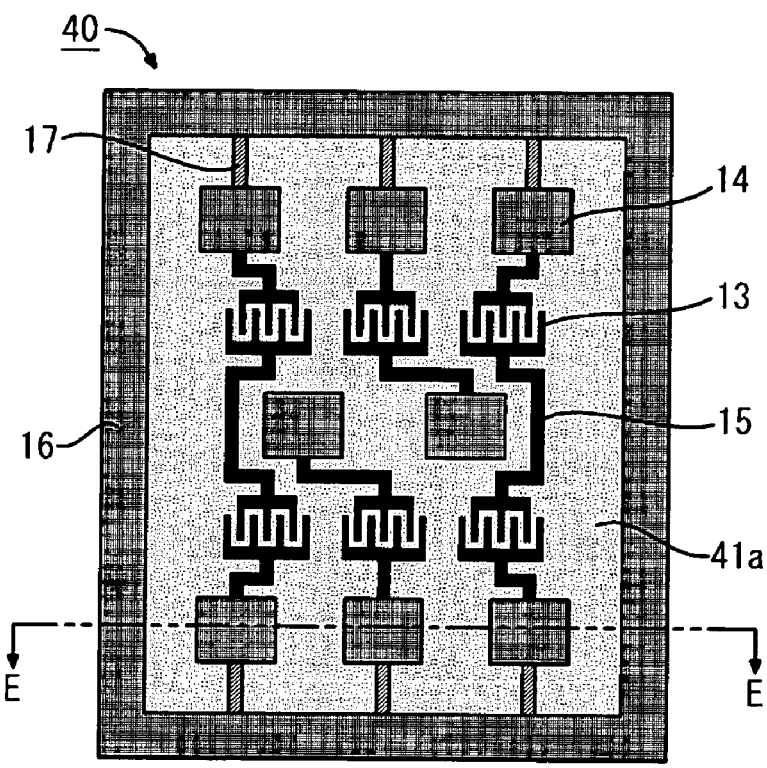
FIG. 15A is a plan view of a SAW chip according to a third embodiment of the present invention.
Figure 15B:
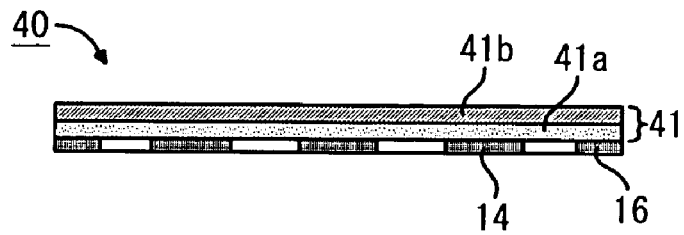
FIG. 15B is a cross-sectional view taken along a line E—E shown in FIG. 15A.

FIG. 15A is a plan view of a SAW chip 40 of a SAW device according to a third embodiment of the present invention, and FIG. 15B is a cross-sectional view taken along a line E-E shown in FIG. 15A.

The SAW chip 40 has a piezoelectric substrate 41a like an LT substrate, to the backside of which is joined another substrate 41b made of a material different from the piezoelectric substrate 41a. The substrate 41b serves as a support substrate, and may, for example, be a silicon substrate. The substrates 41a and 41b form a joined substrate.

Preferably, the support substrate 41b has a smaller Young's modulus and a smaller linear expansion coefficient than those of the piezoelectric substrate 41a. A sapphire substrate or silicon substrate may be used as the supporting substrate 41b. The use of the above support substrate 41b restricts thermal expansion of the piezoelectric 41a, and reinforces the strength thereof so that the required strength of the piezoelectric substrate can be achieved by the support substrate. Thus, the joined substrate can be made thinner than the piezoelectric substrate conventionally used, so that the SAW chip can be thinned. When the support substrate 41b is made of silicon, which is easily processible, the SAW device can be produced more easily and precisely. Further, the wafer-level process can be used, so that the productivity can be improved. From the aforementioned viewpoints, preferably, the support substrate 41 is a silicon substance that has a resistivity as low as 1000 Ω·m or greater in order to avoid degradation of the filter characteristic stemming from the resistance of silicon.

It is preferable that the piezoelectric substrate 41a and the support substrate 41b are joined by the joining method based on the surface activation process. Thus, the substrates 41a and 41b can be joined more strongly and even at room temperature. This prevents occurrence of any damages during process and degradation of the characteristic. Improved joining strength enables a reduced joining interface area, so that the SAW chip 40 can be downsized. Further, improved joining strength effectively restricts thermal expansion of the LT substrate 41a by the silicon substrate 41b, so that the frequency stability for temperature variation can be improved.

Figure 16A:
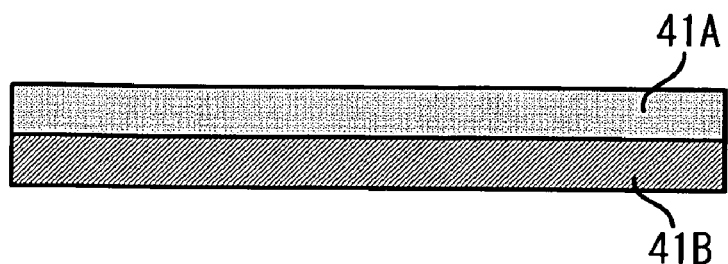
FIGS. 16A and 16B show a method of producing a joined substrate used in the third embodiment.
Figure 16B:
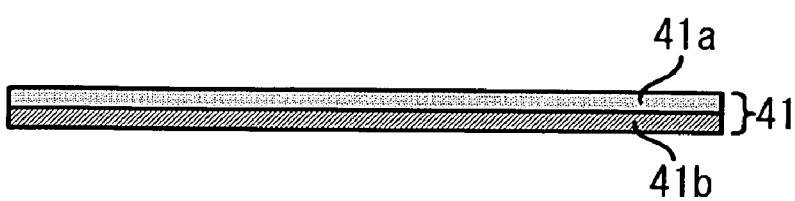

The SAW chip 40 can be produced as shown in FIGS. 16A and 16B. FIG. 16A shows a step of joining an LT substrate 41A and a silicon substrate 41B. For example, the LT substrate 41A is 250 μm thick, and the silicon substrate 41B is also 250 μm thick. Preferably, the substrates 41A and 41B are joined by using the surface activation process. However, an adhesive such as resin may be used for joining.

The joined substrate is grinded and polished from both sides thereof, so that the joined substrate 41 composed of the substrates 41a and 41b can be produced. The joined substrate 41 is thinner than the LT substrate alone. Then, the joined substrate 41 is processed in such a manner as shown in FIGS. 9A through 9J, wherein the joined substrate 41 is substituted for the LT substrate 11. The silicon substrate 41a may be grinded and polished before or after the IDTs 13, the pads 14, the wiring patterns 15 and the metal film 16 are formed on the LT substrate 41a, and before or after joining.

(Fourth Embodiment)

Figure 17A:
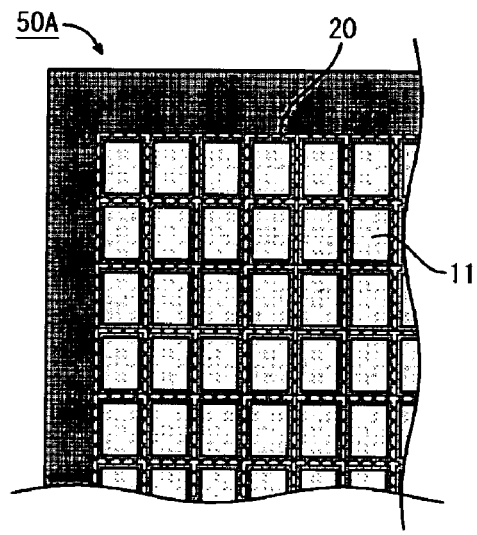
FIG. 17A is a plan view of a part of a substrate in which SAW chips, each shown in FIGS. 6A and 6B, are integrally arranged in rows and columns according to a fourth embodiment.
Figure 17B:
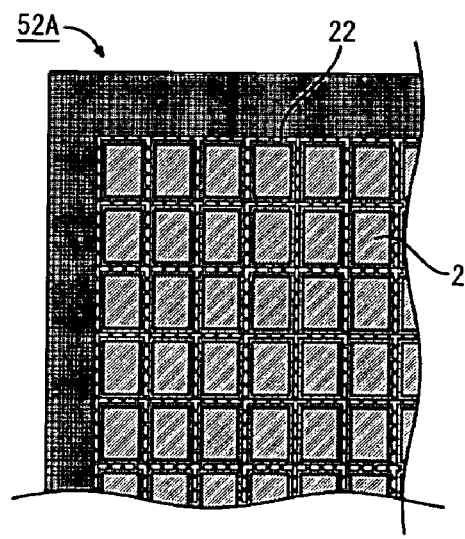
FIG. 17B is a plan view of a part of a substrate in which base substrates, each shown in FIGS. 7A through 7C, are integrally arranged in rows and columns.

A fourth embodiment of the present invention is directed to fabricating a large number of SAW devices at a time. For this purpose, substrates 50A and 52A respectively shown in FIGS. 17A and 17B are used. The substrate 50A has a large number of SAW chips 20 that are integrally arranged in rows and columns. The substrate 52A has a large number of base substrates 22 that are integrally arranged in rows and columns. The substrates 50A and 52A are joined and divided into SAW devices by a dicing process with a dicing blade or laser beam. The use of the substrates 50A and 52A reduces the cost.

Holes for dicing may be formed simultaneously when the vias 6a and 7a are formed in the step of FIG. 11F or FIG. 12G. The use of holes for dicing enables rapid and accurate dicing work. The other structures, fabrication method and effects of the fourth embodiment are the same as those of the previous embodiments.

(Fifth Embodiment)

Figure 18:
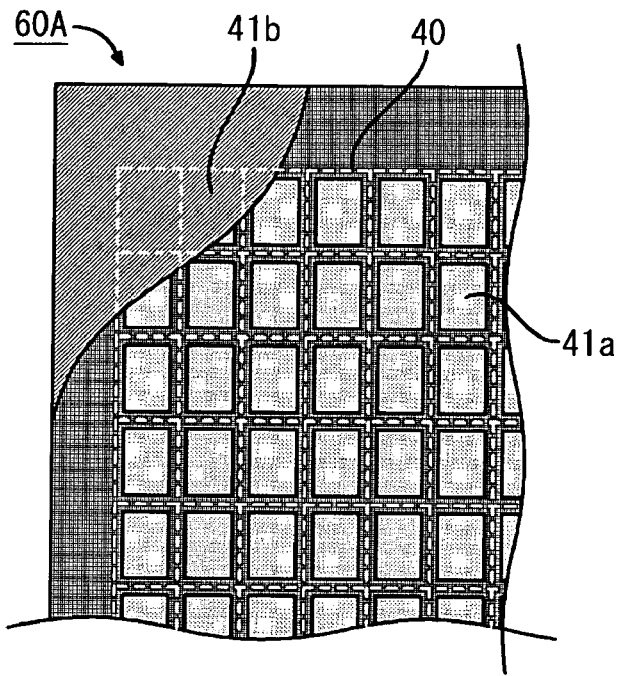
FIG. 18 is a plan view of a part of a substrate in which SAW chips are integrally arranged in rows and columns according to a fifth embodiment.

The SAW device of the third embodiment may be produced by a process similar to that of the fourth embodiment. In this case, a substrate 60A as shown in FIG. 18 is used. The substrate 60A has SAW chips 40 integrally arranged in rows and columns. The piezoelectric substrate 41a of the substrate 60A is supported by the support substrate 41b. The base substrate used in the fourth embodiment may be used in the fifth embodiment.

The other structures, fabrication method and effects of the fifth embodiment are the same as those of the previous embodiments.

(Sixth Embodiment)

Figure 19:
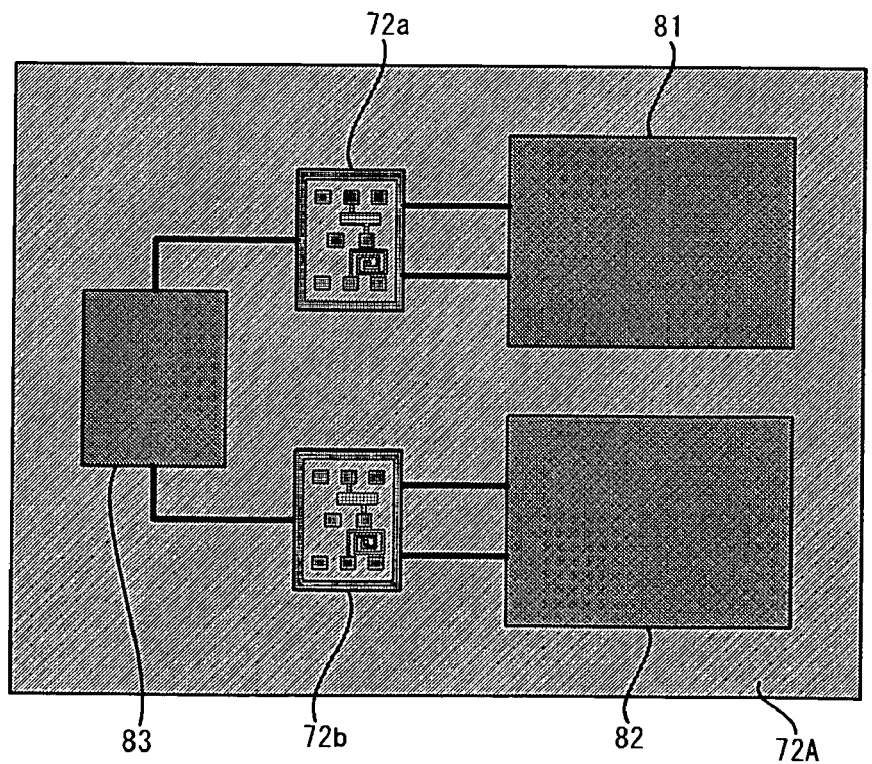
FIG. 19 is a plan view of a SAW device equipped with an LTCC substrate according to a sixth embodiment.

A sixth embodiment of the present invention is directed to joining the base substrate 22 or 42 directly to a substrate of low-temperature co-fired ceramics (LTCC) or a printed-circuit board. FIG. 19 is a plan view of an LTCC substrate 72A on which a chip 81 for a transmit circuit, a chip 82 for a receive circuit, and an RF circuit 83 are mounted. Base substrates 72a and 72b, which correspond to, for example, the aforementioned base substrates 22, are provided on the LTCC substrate 72A and are positioned on transmission lines that connect the RF circuit 83 to the chips 81 and 82. The base substrates 72a and 72b have pads connected to the transmission lines. The SAW chips 20 are joined to the base substrates 72a and 72b so that the metal films of the chips 20 and the base substrates 72a and 72b are joined together.

(Seventh Embodiment)

Figure 20A:
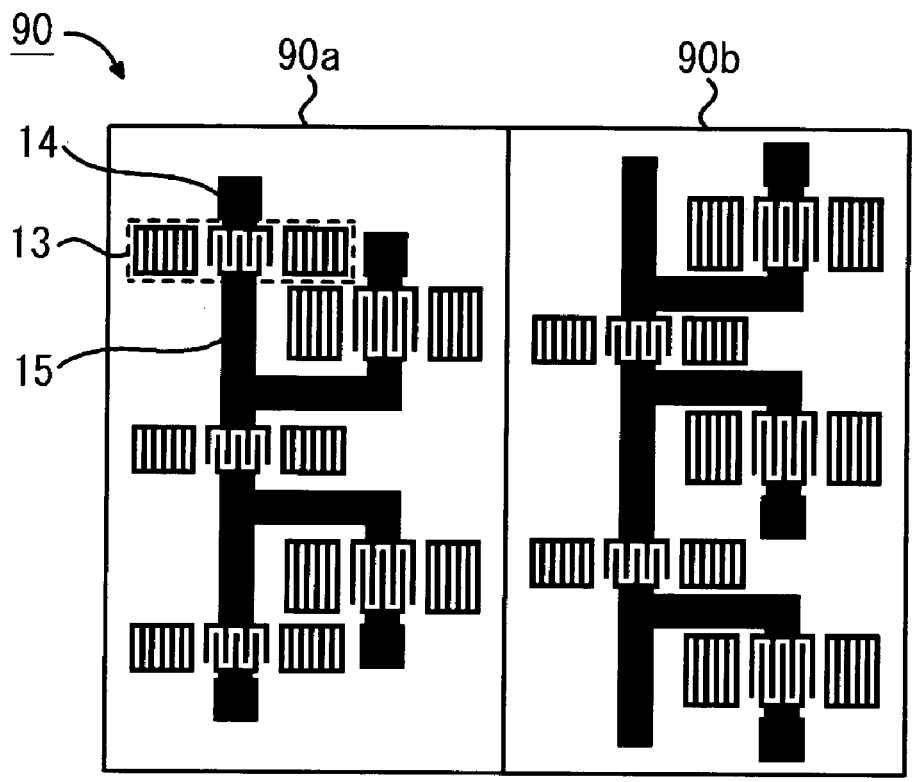
FIG. 20A is a plan view of a duplexer according to a seventh embodiment.

A seventh embodiment of the present invention is a SAW device equipped with two or more SAW filters, whereas any of the aforementioned embodiments is equipped with only one SAW filter. FIG. 20A shows a SAW chip that is a duplexer 90, which has a transmit filter 90a and a receive filter 90b.

Figure 20B:
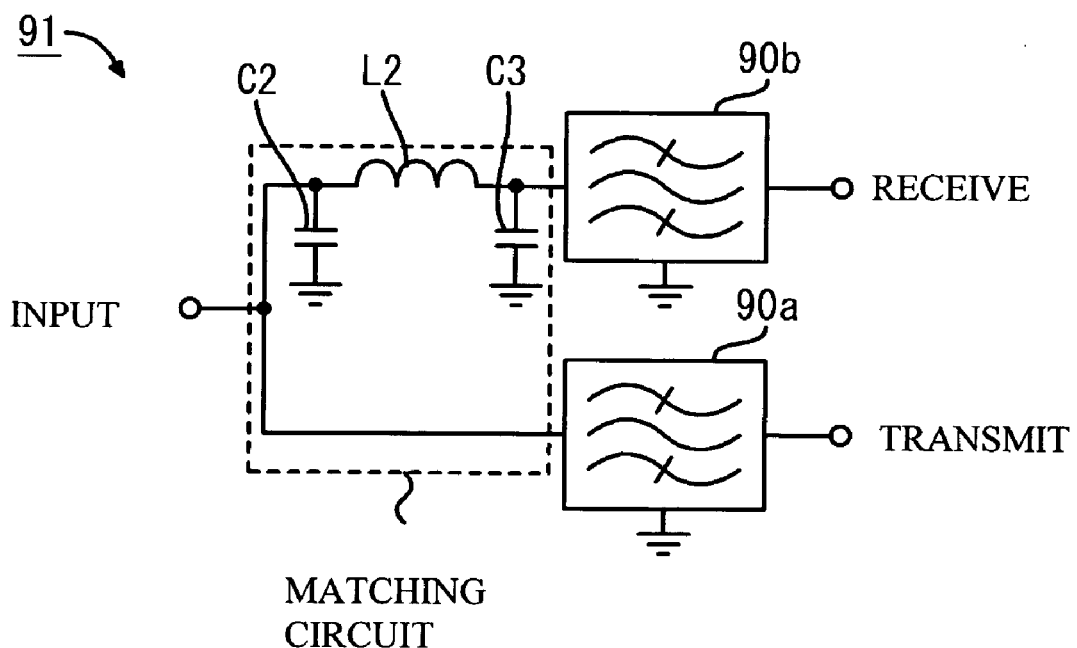
FIG. 20B is a circuit diagram of a SAW device equipped with the duplexer shown in FIG. 20A.

FIG. 20B shows a SAW device equipped with the duplexer 90 and a matching circuit interposed between a common input terminal and the receive filter 90b. The matching circuit shown in FIG. 20B is a low-pass filter made up of capacitors C2 and C3 and an inductor L2. The capacitors C2 and C3 are connected between ends of the inductor L2 and ground. The low-pass filter may be provided between the common input terminal and the transmit filter 90a instead of or in addition to the low-pass filter for the receive filter 90b. For example, the low-pass filter may be applied to only the higher frequency side. The matching circuit is not limited to the low-pass filter.

The present invention is not limited to the specifically disclosed embodiments, and other embodiments, variations and modifications may be made without departing from the scope of the present invention.

The present application is based on Japanese Patent Application No. 2003-096577 filed on Mar. 31, 2003, the entire disclosure of which is hereby incorporated by reference.

What is claimed is:

1. A surface acoustic wave device comprising:
   a piezoelectric substrate having a first surface on which comb-like electrodes, first pads connected thereto, and a first film are provided, the first film being located so as to surround the comb-like electrodes;
   a base substrate having a second surface on which second pads joined to the first pads and a second film joined to the first film are provided;
   an electronic element provided on an area of the second surface facing the first surface; and
   a ceramic substrate supporting the base substrate, a chip electronically coupled to the second pads being mounted on the ceramic substrate, the base substrate having a plate shape, and the first and second films joined by a surface activation process defining a cavity in which the comb-like electrodes, the first and second pads, and the electronic element are hermetically sealed.

2. The surface acoustic wave device as claimed in claim 1, wherein each of the first and second films contains a metal as a major component.

3. The surface acoustic wave device as claimed in claim 1, wherein the first and second films are joined via joining surfaces that contain gold.

4. The surface acoustic wave device as claimed in claim 1, wherein the base substrate is one of a semiconductor substrate and an insulator substrate.

5. The surface acoustic wave device as claimed in claim 1, wherein the base substrate is made of silicon.

6. The surface acoustic wave device as claimed in claim 1, wherein the first film is provided on peripheral portions on the first surface of the piezoelectric substrate, and the second film is provided on peripheral portions on the second surface of the base substrate.

7. The surface acoustic wave device as claimed in claim 1, further comprising an impedance matching circuit on the second surface of the base substrate, the impedance matching circuit being coupled to at least one of the comb-like electrodes.

8. The surface acoustic wave device as claimed in claim 1, wherein the comb-like electrodes and the first pads form a transmit filter and a receive filter.

9. The surface acoustic wave device as claimed in claim 1, wherein:
   the comb-like electrodes and the first pads form a transmit filter and a receive filter;
   the surface acoustic wave device comprises an impedance matching circuit coupled to at least one of the transmit filter and the receive filter, and a common terminal via which an external connection with the impedance matching circuit can be made.

10. The surface acoustic wave device as claimed in claim 1, wherein the base substrate has via-wiring lines connected to the second pads, so that electric connections with the first pads can be made on a surface of the base substrate opposite to the second surface.

11. A surface acoustic wave device comprising:
    a piezoelectric substrate having a first surface on which comb-like electrodes, first pads connected thereto, and a first film are provided, the first film being located so as to surround the comb-like electrodes; and
    a base substrate having a second surface on which second pads joined to the first pads and a second film joined to the first film are provided,
    the first and second films joined by a surface activation process defining a cavity in which the comb-like electrodes and the first and second pads are hermetically sealed,
    wherein the surface acoustic wave device further comprises a support substrate joined to a third surface of the piezoelectric substrate opposite to the first surface;
    the piezoelectric substrate and the support substrate have been subjected to the surface activation process; and
    the support substrate is one of a silicon substrate and a sapphire substrate.

12. A method of fabricating a surface acoustic wave device comprising the steps of:
    (a) forming a first film on a first surface of a piezoelectric substrate on which comb-like electrodes and first pads are provided, wherein the first film surrounds the comb-like electrodes and the first pads and is provided along edges of the piezoelectric substrate;
    (b) forming a second film on a second surface of a base substrate comprising second pads, wherein the second film is provided along edges of the base substrate, and a position of the second film and the second pads corresponds to a position of the first film and the first pads respectively;
    (c) applying a surface activation process to surfaces of the first film and surfaces of the second film; and
    (d) joining the first film and the second film so as to join the activated surfaces thereof, wherein the comb-like electrodes, the first pads and the second pads are hermetically sealed in a cavity defined by the first film and the second film,
    edges of the first and second films being flush with side surfaces of the piezoelectric substrate and those of the base substrate and forming parts of side surfaces of the surface acoustic wave device, the base substrate having a contact hole for making an external connection with the first and second films.

13. A method of fabricating a surface acoustic wave device comprising the steps of:
   (a) forming a first film on a first surface of a piezoelectric substrate on which comb-like electrodes and first pads are formed so as to be surrounded by the first film;
   (b) forming a second film on a second surface of a base substrate on which second pads and an electronic element are formed so as to be surrounded by the second film, the second film and the second pads corresponding to the first film and the first pads in position, the base substrate having a plate shape and being supported by a ceramic substrate on which a chip electronically coupled to the electronic element is mounted;
   (c) subjecting a surface activation process to surfaces of the first and second films; and
   (d) joining the first and second films so as to join activated surfaces thereof,
   the comb-like electrodes, the first and second pads and the electronic element being hermetically sealed in a cavity defined by the first and second films.

14. The method as claimed in claim 13, wherein the steps (a) and/or (b) forms the first and/or second film that contains a metal as a major component.

15. The method as claimed in claim 13, further comprising a step of forming an electric element on the second surface.

16. The method as claimed in claim 13, further comprising a step of forming via-wiring lines in the base substrate so that the second pads can be extended to a third surface of the base substrate opposite to the second surface.

17. A method of fabricating a surface acoustic wave device comprising the steps of:
   (a) forming a first film on a first surface of a piezoelectric substrate on which comb-like electrodes and first pads are formed so as to be surrounded by the first film;
   (b) forming a second film on a second surface of a base substrate, the second film corresponding to the first film in position;
   (c) subjecting a surface activation process to surfaces of the first and second films; and
   (d) joining the first and second films so as to join activated surfaces thereof,
   the comb-like electrodes being hermetically sealed in a cavity defined by the first and second films,
   wherein the method further comprises a step of joining a support substrate to a backside of the piezoelectric substrate opposite to the first surface after an interface between the piezoelectric substrate and the support substrate is subjected to the surface activation process,
   the support substrate being one of a silicon substrate and a sapphire substrate.

18. A surface acoustic wave device comprising:
   a piezoelectric substrate having a first surface on which comb-like electrodes, first pads connected thereto, and a first film are provided, the first film surrounding the comb-like electrodes;
   a base substrate having a second surface on which second pads joined to the first pads and a second film joined to the first film are provided; and
   an electronic element provided on an area of the second surface facing the first surface, wherein the first film and the second film are configured to be joined by a surface activation process and to define a cavity in which the comb-like electrodes, the first pads, the second pads, and the electronic element are hermetically sealed,
   the second pads being electrically extended via a through hole penetrating the base substrate, to a third surface of the base substrate opposite to the second surface thereof,
   the first and second films being electrically extended, via another through hole penetrating the base substrate, to the third surface,
   the piezoelectric substrate and the base substrate having an identical width and length forming flat side surfaces of the surface acoustic wave device.

19. A method of fabricating a surface acoustic wave device, comprising the steps of:
   (a) forming a first film on a first surface of a piezoelectric substrate comprising comb-like electrodes and first pads, wherein the first film surrounds the comb-like electrodes and the first pads;
   (b) forming a second film on a second surface of a base substrate comprising second pads and an electronic element, wherein the second film surrounds the second pads and the electronic element, and a position of the second film and the second pads corresponds to a position of the first film and the first pads, respectively;
   (c) applying a surface activation process to surfaces of the first film and surfaces of the second film; and
   (d) joining the first film and the second film so as to join the activated surfaces thereof, wherein the comb-like electrodes, the first pads, the second pads, and the electronic element are hermetically sealed in a cavity defined by the first film and the second film,
   the second pads being electrically extended, via a through hole penetrating the base substrate, to a third surface of the base substrate opposite to the second surface thereof,
   the first and second films being electrically extended, via another through hole penetrating the base substrate, to the third surface,
   the piezoelectric substrate and the base substrate having an identical width and length forming flat side surfaces of the surface acoustic wave device.

20. A surface acoustic wave device comprising:
   a piezoelectric substrate having a first surface on which comb-like electrodes, first pads connected thereto, and a first film are provided, the first film being provided along edges of the piezoelectric substrate and being located so as to surround the comb like electrodes; and
   a base substrate having a second surface on which second pads joined to the first pads and a second film joined to the first film are provided, the second film being provided along edges of the base substrate,
   wherein the first and second films are configured to be joined by a surface activation process and define a cavity in which the comb-like electrodes and the first and second pads are hermetically sealed,
   edges of the first and second films being flush with side surfaces of the piezoelectric substrate and those of the base substrate and forming parts of side surfaces of the surface acoustic wave device,
   the base substrate having a contact hole for making an external connection with the first and second films.

* * * * *